US007857959B2

(12) United States Patent
Fourkas et al.

(10) Patent No.: US 7,857,959 B2
(45) Date of Patent: Dec. 28, 2010

(54) METHODS OF FABRICATING NANOWIRES AND ELECTRODES HAVING NANOGAPS

(75) Inventors: John T. Fourkas, Bethesda, MD (US); Michael J. Naughton, Norwood, MA (US); Richard A. Farrer, Pueblo, CO (US)

(73) Assignee: The Trustees of Boston College, Chestnut Hill, MA (US)

( * ) Notice: Subject to any disclaimer, the term of this patent is extended or adjusted under 35 U.S.C. 154(b) by 893 days.

(21) Appl. No.: 11/804,464

(22) Filed: May 18, 2007

(65) Prior Publication Data

US 2010/0258443 A1     Oct. 14, 2010

Related U.S. Application Data

(63) Continuation of application No. PCT/US2005/041474, filed on Nov. 15, 2005.

(60) Provisional application No. 60/629,742, filed on Nov. 19, 2004.

(51) Int. Cl.
  *C25D 5/02*    (2006.01)
(52) U.S. Cl. ........................ 205/118; 205/223
(58) Field of Classification Search ................ 205/118, 205/136, 170
   See application file for complete search history.

(56) References Cited

U.S. PATENT DOCUMENTS

| | | | |
|---|---|---|---|
| 5,747,180 A | 5/1998 | Miller et al. | 428/601 |
| 6,172,902 B1 | 1/2001 | Wegrowe et al. | 365/158 |
| 6,185,961 B1 | 2/2001 | Tonucci et al. | 65/60.4 |
| 6,383,923 B1 | 5/2002 | Brown et al. | 438/666 |
| 6,683,783 B1 | 1/2004 | Smalley et al. | 361/502 |
| 6,705,152 B2 | 3/2004 | Routkevitch et al. | 73/31.05 |
| 6,717,777 B2 | 4/2004 | Den et al. | 360/324 |
| 6,720,728 B2 | 4/2004 | Den et al. | 313/495 |
| 6,737,286 B2 | 5/2004 | Tao et al. | 438/17 |

(Continued)

FOREIGN PATENT DOCUMENTS

WO     WO 03/054931     7/2003

(Continued)

OTHER PUBLICATIONS

Foss et al., "Template-Synthesized Nanoscopic Gold Particles: Optical Spectra and the Effects of Particle Size and Shape", J. Phys. Chem, (Feb. 15, 1994) vol. 98, pp. 2963-2971.

(Continued)

*Primary Examiner*—Nam Nguyen
*Assistant Examiner*—Luan V Van
(74) *Attorney, Agent, or Firm*—Greenberg Traurig LLP; David J. Dykeman; Danielle T. Abramson (57) ABSTRACT

A cost-effective and highly reproducible method of fabricating nanowires, and small gaps or spacings in nanowires is disclosed. The nanogaps bridge an important size regime between 1 nm and 100 nm. The nanogaps can be selectively predetermined to be as small as 1.0 nm, or larger than 1000 nm. These electrode gaps can be useful in preparing molecular electronic devices that involve making electrical contact to individual molecules, such as biomolecules, or small clusters of molecules. Microelectrodes having nanogaps for electrical and magnetic applications formed by the method, and as well as biosensors and their use in detecting a biological species, such as DNA, are also disclosed.

20 Claims, 2 Drawing Sheets

U.S. PATENT DOCUMENTS

| 6,743,408 | B2 | 6/2004 | Lieber et al. ............. 423/447.1 |
| 6,755,956 | B2 | 6/2004 | Lee et al. ................... 205/104 |
| 2004/0104129 | A1 | 6/2004 | Gu et al. ..................... 205/775 |
| 2004/0110163 | A1 | 6/2004 | Kotlyar et al. ................. 435/6 |

FOREIGN PATENT DOCUMENTS

| WO | WO 2004/036217 | 4/2004 |
| WO | WO 2004/051219 | 6/2004 |

OTHER PUBLICATIONS

He et al., "Electrochemical Fabrication of Atomically Thin Metallic Wires and Electrodes Separated with Molecular-Scale Gaps", Journal of Electroanalytical Chemistry, (Jan. 7, 2002), vol. 522, pp. 167-172.

Naughton et al. "E-Beam Fabrication of Electrodes for Transport Measurement Across Single Molecules", Cornell Nanofabrication Facility, National Nanofabrication Users Network, (2001), Project # 412-91, pp. 132-133.

Nicewarner-Pena et al, "Submicrometer Metallic Barcodes", Science, (Oct. 5, 2001) vol. 294, pp. 137-141.

Oh et al., "Minimization of Electrode Polarization Effect by Nanogap Electrodes for Biosensor Applications", IEEE The Sixteenth Annual International Conference, (Jan. 23, 2003) pp. 52-55.

Park et al., "Fabrication of Metallic Electrodes with Nanometer Separation by Electromigration", Appl. Phys. Lett., (1999), vol. 15, pp. 1-3.

Porath et al., "Direct Measurement of Electrical Transport Through DNA Molecules", Nature, (Feb. 10, 2000) vol. 403, pp. 635-638.

Sordan et al. "Removable Template Route to Metallic Nanowires and Nanogaps", Appl. Phys. Lett., (Sep. 24, 2001) vol. 79, No. 13, pp. 2073-2075.

Yu et al., "The Kond Effect in C60 Single-Molecule Transistors", American Chemical Society, (2004), vol. 4, No. 1, pp. 79-83 (Published on Web Dec. 9, 2003).

PCT International Search Report based on PCT/US05/41474 dated Oct. 29, 2007.

METHODS OF FABRICATING NANOWIRES AND ELECTRODES HAVING NANOGAPS

RELATED APPLICATIONS

This application is a continuation of PCT International Patent Application Number PCT/US2005/041474, filed Nov. 15, 2005, which claims the benefit of U.S. Provisional Application Ser. No. 60/629,742, filed Nov. 19, 2004, and the entirety of these applications are hereby incorporated herein by reference for the teachings therein.

GOVERNMENT SUPPORT

The present invention was made with partial support from The National Science Foundation Grant Number 0210533. The United States Government retains certain rights to the invention.

FIELD

The presently disclosed embodiments relate to a method of making nanorods and/or nanowires having an inner section, inner segment or inner section that is of a predetermined or controlled length. The nanorods or nanowires can be sectioned, multi-sectioned, segmented or rod-shaped like totem-poles and are formed using metals, metal alloys, semiconducting material or combinations thereof. The nanowires and nanorods can be used to fabricate microelectrodes and biosensors having small nanogaps for electrical, magnetic and biological applications. The nanogaps can be as small as about 0.1 nm or can be larger than 1000 µm. The microelectrodes of the presently disclosed embodiments can be used for detecting biological molecules in biotechnological applications such as detecting DNA, and as electrodes in molecular electronics.

BACKGROUND

Molecular electronic devices offer the possibility of vastly increased circuit element density, and thus computing power, in future integrated circuits. Moreover, nanoscale molecular electronics is a potential platform for quantum computing, and for biosensing and genetic screening, among others possibilities. A large problem at present in the field of molecular electronics concerns making electrical contact to nanoscale objects such as molecules, which typically range in size from about 1 to about 10 nanometers. The future of molecular electronics will depend on the ability to contact molecules to the outside world in a reliable fashion. However, until now, there has been no known reliable and cost-effective method of creating such nanoscale electrode gaps, especially in the range of gap sizes between about 1 nm and 20 nm.

The typical route to making such an electrical contact is to fabricate macroscopic electrode structures that successively connect to smaller and smaller electrodes, ending in a nanoscale electrode gap. After electrode fabrication, this gap is bridged by (connected to) a molecule of interest, forming a continuous electrical circuit. That is, a molecule or assembly of molecules is arranged to be situated in the gap so formed in such a way as to form a continuous electrical connection across the gap. This is achieved by known means, such as electrostatic trapping, or chemical binding.

A technology currently used to fabricate gaps is electron beam lithography (EBL, or e-beam). In this technology, a focused beam of electrons is used to expose an appropriate polymeric "resist" material coating a substrate, either weakening (scission) or strengthening (cross-linking) chemical bonds in the exposed region of the polymer, thus rendering the polymer either soluble or insoluble, respectively. This allows one to wash away the weaker resist material (either the exposed or the unexposed region), exposing the area underneath for future deposition of material. Creating feature sizes below 1000 nm generally requires EBL, while those larger than 1000 nm can be fabricated with less expensive, photo-lithographic techniques.

With a large amount of effort, the best EBL systems theoretically may be capable of defining nanostructures, including gaps between nanowires, although not with a high degree of reproducibility. Even an expert user, however, will have great difficulty achieving reliable electrode gaps of a small size on even the best available commercial instruments. Typical gap sizes may be between 20 and 200 nm. However, the typical cost of an EBL system with such capabilities is currently between one million and fifteen million dollars, making this a very expensive technique. Feature sizes, including electrode gaps, smaller than 20 nm are produced with very low yields, of the order of 10%.

Another technology that exists for the fabrication of nanoscale electrode gaps is "electromigration". In electromigration, an electrode is formed having a continuous metallic nanowire defined on a substrate with the added feature of having a narrow constriction along the length (usually in the middle) of the nanowire. This is achieved by using e-beam lithography to fabricate the thin metal electrode on a substrate. After fabrication is complete, electric currents are passed through the electrode in increasing amounts to induce heating. By virtue of possessing a smaller cross-section, the constricted area has a larger electrical resistance than the remaining unconstricted nanowire, and accordingly more heat is dissipated at the constriction. This occurs because the rate of heat dissipation is directly proportional to the resistance. Upon applying a high enough current to attain a threshold value, the heat generated thermally induces the nanowire to break at the narrow constriction, creating a small gap. This is similar to the mechanism of blowing a household fuse with an overload of electrical current.

Electromigration has been shown to reliably produce electrode gaps of up to 1 nm in size in nanoscale wires. However, once the gap opens, no more current can flow and no more shaping of the gap is possible. Thus, larger gaps of up to 10 nm may not be possible by this method because not enough heat is generated to facilitate an increase of gap size after the thermally induced break occurs. Accordingly, the gaps produced by this technology are limited to about less than 1 nm in size.

In addition, this may not be a highly reproducible method. Although gaps of less than 1-nm in size have been reportedly reproduced, other groups have reported wide variability, with yields of on the order of 10%. *Fabrication of metallic electrodes with nanometer separation by electromigration*, Hongkun Park, Andrew K. L. Lim, A. Paul Alivisatos, Jiwoong Park, and Paul L. McEuen, Appl. Phys. Lett. 75, 301 (1999). *The Kondo effect in $C_{60}$ single-molecule transistors*, L. H. Yu and D. Natelson, Nano Lett. 4, 79 (2004). The latter reports the aforementioned variability. Thus, this technology has limitations due to the gap formation being self-limiting to the few nanometer range and to its apparently low reproducibility.

U.S. Pat. No. 6,737,286 discloses an apparatus and a method for fabricating self-terminating molecular-scale and atomic scale contacts and gaps between electrodes, wherein a pair of electrodes separated by a gap are subjected to an electrical etching process that decreases the gap between them.

U.S. Pat. No. 6,383,923 discloses a circuit device comprising two or more circuit sections vertically interconnected with nanowires for nanoscale circuit interconnections and tactile sensor devices. The nanowire contacts are grown in dissolvable or removable substrate.

However, none of the above address the primary concern in electrode preparation, which is that the separation gap between two electrodes be of the proper size to successfully bridge biomolecules such as DNA strands of appropriate length for biosensing. The lengths of these DNA strands are about 10 nm, or about 30 base pairs. Strands much shorter (~1 nm) are non-specific and thermodynamically unstable, whereas strands much longer (~100 nm) are statistically less likely to hybridize in the sensor configuration. Although electrode gaps down to 10 nm have been reported, there remains quite a lot of variation in reproducibility and in the gap size, particularly with gaps in the 20 to 40-nm range. *Direct measurements of electrical transport through DNA molecules*, D. Porath, A. Bezryadin, S. deVries, C. Dekker, Nature 403, 635 (2000). Even with a multimillion dollar e-beam writer, the yield of an ideal 10 nm electrode separation may be low. *E-beam fabrication of electrodes for transport measurements across single molecules*, J. Moser, R. Panepucci and M. J. Naughton, National Nanofabrication Users Network, Cornell Nanofabrication Facility 2000-2001 Research Accomplishments, p. 132-133 (2001).

Therefore, there is a need for a significant innovation in producing nanoscale electrode gaps of accurately controlled or predetermined size. Further, there is need in the art for a method to fabricate 10 nm structures in a reliable fashion. Thus, an apparent gap exists in the formation of nanogaps that can be formed: about 1 nm by electromigration and about 100 nm by e-beam in a cost-effective and highly reproducible manner.

SUMMARY

According to aspects illustrated herein, there is provided a cost effective, highly reproducible, soft-lithography technique for the fabrication of microelectrodes and biosensors having precise nanoscale gaps (nanogaps) in metallic electrodes. Fabrication of such nanogaps can be accurately controlled to have a predetermined or fixed length of from about 0.1 nm to about 1000 μm. In an embodiment, the nanogap can be from about 1 nm to about 100 μm. The nanogaps can appear at any chosen point or points in one or more nanowires prepared by the presently disclosed embodiments. The nanowire prepared in accordance with the presently disclosed embodiments can have a controlled or predetermined length of from about 3 nm to about 1000 μm long. In an embodiment, the nanowire can have a length of from about 30 nm to about 100 μm long. The diameter of the nanowire can be within a range of from about 1 nm to about 10 μm. In an embodiment, the diameter of the nanowire can be from about 10 nm to about 1000 nm.

According to aspects illustrated herein, there is provided a nanowire formed as disclosed herein, a method of making a microelectrode having a nanogap using the nanowire, a microelectrode for electrical and/or magnetic applications; and a biosensor having a desired nanogap formed using one or more nanowires of an embodiment disclosed herein. A method for detecting a biological species, such as DNA, is also disclosed. The size of the nanogap can have the same ranges previously disclosed above for the sacrificial metal section.

According to aspects illustrated herein, there is provided a method of making a microelectrode comprising providing at least two electrodes, placing between the two electrodes a nanowire having, e.g., an A-B-C or A-B-A polymetallic, configuration formed in accordance with presently disclosed embodiments; and removing the sacrificial section or segment B to provide a microelectrode having a nanogap. Alternatively, the nanowire can be put on a substrate, the inner metal section etched away to form the gap, and then the electrodes are attached to the outer ends of the two metal A sections (away from former metal B).

The electrodes can be used for electrical applications, magnetic applications or in biosensors devices for biological or biotechnological applications, such as detecting biological molecules as, for example, DNA.

Thus, according to aspects illustrated herein, there is provided a microelectrode that is formed using nanowires prepared according to aspects illustrated herein, having a predetermined nanogap size between about 0.1 nm to about 1000 μm. This microelectrode can be used for electrical applications, magnetic applications or in a biosensor for biotechnological and other biological applications. In a further embodiment, a method of detecting a biological species is also disclosed, wherein a biological sample is provided and a biosensor according to aspects disclosed herein is used to detect a biological species.

BRIEF DESCRIPTION OF THE DRAWING

The presently disclosed embodiments will be further explained with reference to the attached drawings, wherein like structures are referred to by like numerals throughout the several views. The drawings are not necessarily to scale, the emphasis having instead been generally placed upon illustrating the principles of the presently disclosed embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

Nanotechnology, in general, and bionanotechnology, in particular, lie at the interface of physics, chemistry and biology. They both are concerned with nanoscale systems that may be produced from a top down approach, where larger units are disassembled, or a bottom up approach involving component assembly. Utilizing nanofabrication and or processes of molecular self-assembly, nanotechnology allows the preparation of a range of materials and devices including tissue and cellular engineering scaffolds, molecular motors, and arrays of biomolecules for sensor, drug delivery and mechanical applications. Many future devices employed in nanotechnology and bionanotechnology will require the ability to connect electrodes to biological materials such as DNA and proteins, in order to manipulate their electrical, electrochemical, or electromechanical properties. For example, the possibility exists to use DNA molecules on electronic chips as means of data storage or pathogen detection. It may not be feasible to expect that long (hundreds of base pairs) DNA sequences will function appropriately for such purposes, while 10 to 100 base pair sequences can be expected to be appropriate. Strands much shorter than about 10 nm (i.e. ~1 nm) are non-specific and thermodynamically unstable, while strands much longer (~100 nm) are statistically less likely to hybridize in the sensor configuration. Such electronic chips must possess conducting electrodes with gap spacings, to be bridged by biomolecules, of this appropriate size: about 1 to about 100 nm. The present technology facilitates such electrode fabrication.

According to aspects illustrated herein, there is provided electrode nanogaps having a length of between about 1 nanometer and about 1000 micrometers (1000 μm), or even larger, that can be fabricated in a cost-effective and/or highly reproducible fashion. The technique is particularly advantageous since it bridges the about 1 nm and about 100 nm regimes respectively of the electromigration and EBL technologies discussed previously. The nanowires disclosed herein are prepared by the electrodeposition of multiple (more than one) metals into nanoporous membranes, followed by selective chemical etching to remove a sacrificial section of the multisectioned nanowire to create the electrode gap. According to aspects of the method presently disclosed, accuracy in defining a nanoscale gap stems from the accuracy in defining the thickness of the sacrificial metal section. This in turn is predetermined or controlled by the electric current density and the time employed in the electrodeposition. Thus, various aspects of the disclosed method of making nanowires and microelectrodes can be used to fabricate reproducible electrode spacings (gaps) on the about 10 nm scale.

Moreover, various aspects of the method disclosed herein further provides a cost-effective and highly reproducible method of forming microelectrodes and biosensors, with nanogaps from about 1.0 nm to about 1000 μm, to be used in electrical, biological and biotechnological applications. The method uses the nanowires and nanorods prepared by embodiments disclosed herein to form an accurately controlled, predetermined, size of the nanogap. The current disclosure further provides nanoscale electrode gaps in wires on or above substrates that do not rely on being formed by either electron beam lithography (EBL) or electromigration. For the purposes of this disclosure, the terms "nanowire" and "nanorod" are used interchangeably and nanoscale refers to distances and features below about 1000 nanometers (one nanometer equals one billionth of a meter).

According to aspects illustrated herein, there is provided a method that may utilize a technique of template synthesis, whereby metallic nanorods or nanowires are synthesized inside the plurality of pores of a porous membrane by electrochemical means to form a composite of the membrane and a trisectioned metallic configuration. An aspect of the current disclosure is the sequential deposition of two or more different metals to form a nanowire (e.g., a bimetallic or trimetallic nanowire) with one or more metals sandwiched in between the other metals. The metal sandwiched in between can be used as a "sacrificial" section in the formation of an electrode, microelectrode or biosensor.

The sacrificial section can have its thickness accurately controlled or predetermined to be at a nanoscale level. The thickness can be determined from the amount of time a metal solution undergoes electroplating. The sacrificial section can be removed or chemically etched away after fabrication, leaving behind a gap of a controlled or predetermined size in the middle of the wire. Thus, rather than attempting to lithographically define at best an about 10 nm gap in an exposed e-beam resist, or thermally break an electrode with electric current leaving behind at most an about 1 nm gap, aspects of the presently disclosed method offers the ability to accurately define a gap anywhere from about 1 nanometer to about 1 micrometer in size, in a "soft-lithography" chemical and electrochemical process that can be cost-effective and can require only inexpensive tools.

Figure 1:
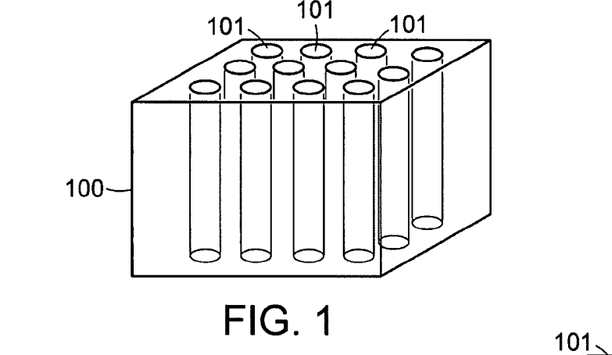
FIG. 1 shows an anodized alumina template having a plurality of pores.

An embodiment of the method disclosed herein of forming nanogaps by template synthesis is depicted in FIGS. 1-7 and is described in detail as follows. A nanoporous membrane 100 is provided having a plurality of pores 101 as shown in FIG. 1. The nanoporous membrane can be purchased commercially or made in house via anodization of a thin metallic film (e.g., aluminum) in an acidic solution (yielding porous alumina, a.k.a. aluminum oxide). Such a membrane is of a nonmetallic material and contains an array of clear-through holes (pores) of substantially uniform diameter. A metal film is deposited onto one surface of the membrane, and a wire is attached to this film, to act as a cathode of an electrolytic cell for electroplating/electrodeposition. The deposition of a metal into the pores occurs by placing a negative charge on the membrane and immersing it into a solution which contains a salt of the metal to be deposited. With the establishment of an electric potential difference between the cathode and a metallic anode immersed in the solution, metallic ions of the salt are formed. These carry a positive charge and are thus attracted to the object. When the metallic ions reach the negatively charged object, they provide electrons to reduce the positively charged ions to metallic form, and fill up the pore.

Figure 2:
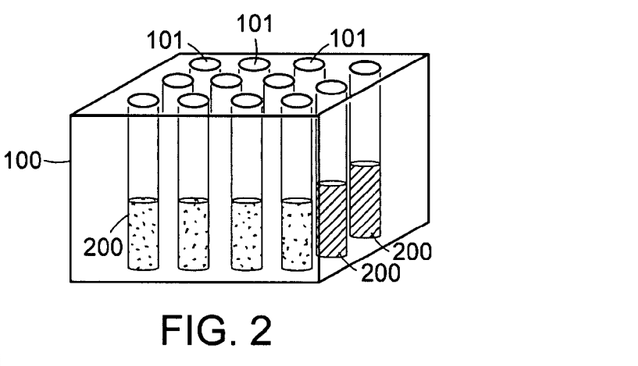
FIG. 2 shows the plurality of pores of the alumina template partially filled with metal A to form a metal A section.
Figure 3:
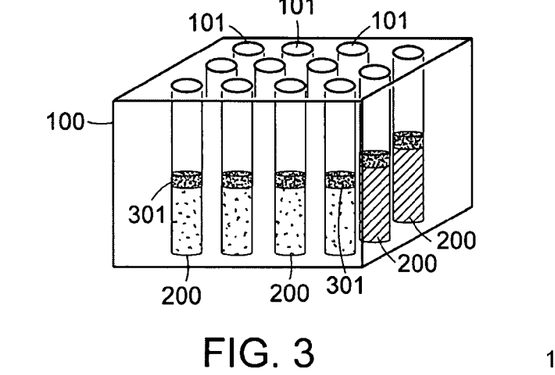
FIG. 3 depicts the pores partially filled with metal B to form a thin layer of metal B (metal B section) on top of the metal section.
Figure 4:
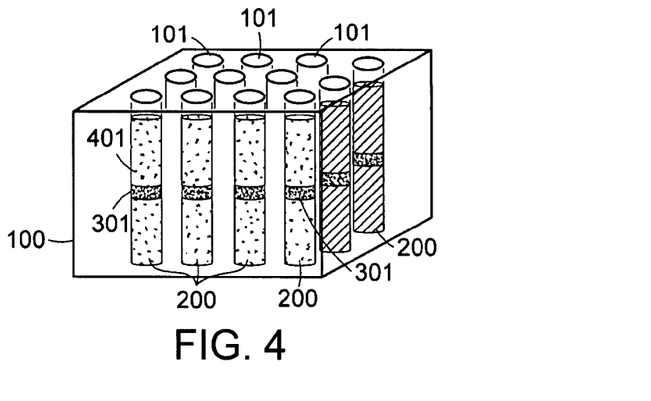
FIG. 4 depicts the pores filled with metal A on top of the layer of metal B and shows the polymetallic A-B-A configuration within a plurality of pores of the anodize alumina template.

Solutions of a metal A, a metal B and a metal C are prepared respectively. Metal A and metal C can be different metals or the same metal (or metallic composition). In FIG. 2, the plurality of pores 101 are partially filled with a metal A by depositing a solution of metal A onto the membrane 200. This can be accomplished by electroplating the solution onto the membrane for a controlled or predetermined amount of time. This is followed by partially filling the pores with metal B 301 by further filling or depositing via electrodeposition a solution of metal B as shown in FIG. 3. A layer of metal B 301 is present on top of metal A 200. Then, as shown in FIG. 4, the pores are completely filled or nearly filled with metal C 401 in the same manner to form a composite of a plurality of polymetallic A-B-C configurations 400 (or A-B-A if A and C are equal) within the plurality of pores of the membrane of the nonmetallic material. The nonmetallic material is subsequently removed by means known in the art, such as by selective chemical etching, by dissolving or via sonication, to provide a plurality of polymetallic, nanowires or nanorods having a multisectioned A-B-C (or A-B-A) configuration 500 depicted in FIG. 5. The nanowires of configuration A-B-C have a metal A section 501, a metal B section 502 and a metal C section 503.

Figure 5:
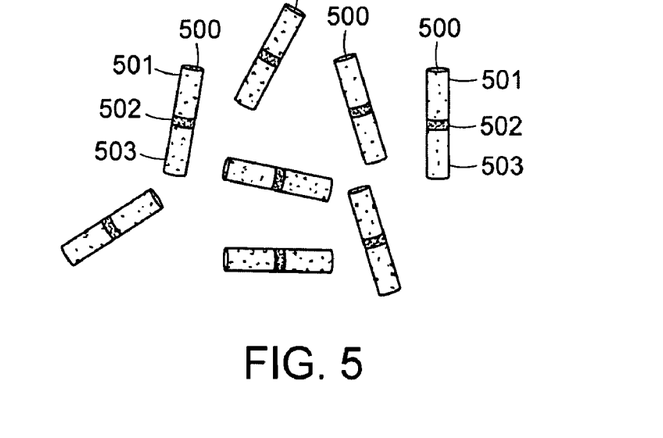
FIG. 5 depicts a plurality of nanowires having a polymetallic A-B-A configuration containing sections of metals A and B after removal by dissolving of the nonmetallic alumina material.

In an embodiment, the thickness of the metal B section 502, sandwiched in the middle between the other metallic sections, is selected to be of a controlled, predetermined nanoscale section. This middle or "sacrificial section" can be removed by chemically etching away the alumina to provide one or more nanowires having an A-B-C (or an A-B-A) configuration 500, with the length of the B section engineered to be a nanogap of a desired size. The size of the gap is at a nanoscale level. In an embodiment, the size of the nanogap ranges from about 1 nm to about 100 nm. Those skilled in the art will recognize that a nanogap of various sizes is within the spirit and scope of the present invention.

Figure 6:
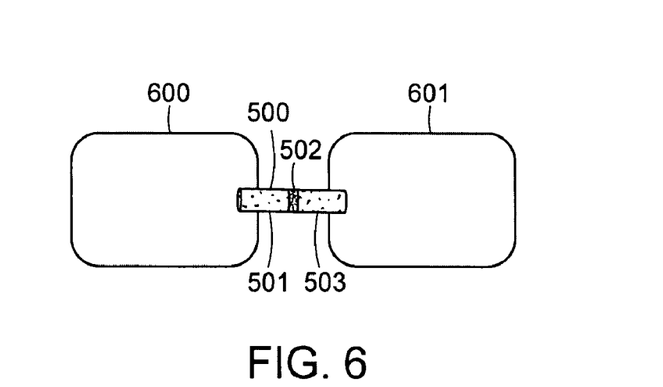
FIG. 6 depicts a nanowire of a polymetallic A-B-A configuration situated between two electrodes.
Figure 7:
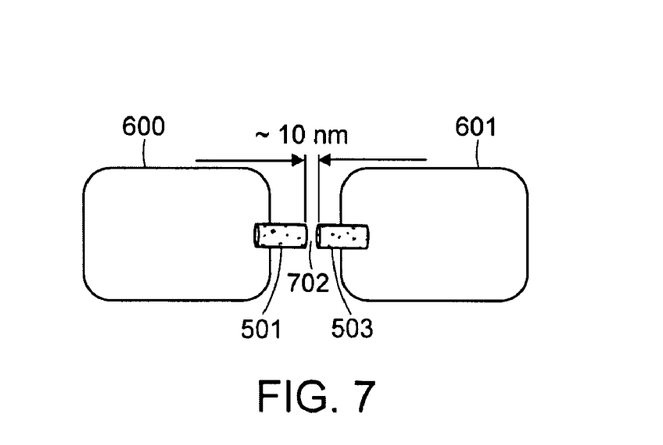
FIG. 7 depicts a microelectrode that is formed upon selectively removing the layer of metal B from the nanowire. The microelectrode contains two electrodes having a 10 nm nanogap between the two nanowire sections.

FIG. 6 shows an embodiment of the presently disclosed nanowire wherein the nanowires are situated between two metal electrodes 600 and 601 on a surface that can have a separation comparable to the total length of the nanowire. For example, the total length can be prearranged to be between 30 nanometers and 100 micrometers. A microelectrode containing a nanogap 702 is subsequently created, as shown in FIG. 7, by chemically and selectively etching away metal B 502 (or by other means known in the art, such as by sonication or by dissolving), while leaving behind nanowire sections of metal A 501. In an embodiment, the microelectrode contains electrodes 600 and 601 having engaged thereto nanowire sections of metal A 501 and metal C 503 that remained engaged on the electrodes after removal of the metal B section 502.

In an embodiment, a microelectrode contains a first electrode, a second electrode and at least two nanowire sections. A first nanowire section is engaged to the first electrode and a second nanowire section is engaged to the second electrode. There is a nanogap between the first nanowire section and the second nanowire section, and the size of the nanogap can be from about 0.1 nm to about 1000 µm.

In an embodiment, a method of making a nanowire is disclosed that provides one or more nanowires having a polymetallic, A-B-C configuration. First, a nanoporous membrane of a nonmetallic material is provided. Then, the plurality of pores on a surface of the membrane are partially filled by electrodeposition with a metal A, followed by partially filling the plurality of pores with a metal B, to form an A/B bimetallic composite. Subsequently, a metal C is deposited onto the surface of the membrane to partially fill or completely fill the plurality of pores and form a composite of an A-B-C polymetallic, configuration within the plurality of pores of the nonmetallic material. The nonmetallic material is subsequently removed from the composite to provide one or more nanowires having a polymetallic, A-B-C configuration having three distinct sections, layers or segments of metals A, B and C. For the purposes of this disclosure, the term "section" includes, but is not limited to, a segment, a layer, a compartment or a component. Thus a multi-sectioned nanowire can be, for example, a segmented nanowire, a multi-sectioned nanowire or multilayered nanowire.

Metals A, B and C can each be, but are not limited to, a metal, a metal alloy, of semiconductor material or combinations thereof. The metal used in the method for each of metal A, metal B and metal C can be, but are not limited to, metals, such as gold, silver, Ni, Cr, Fe, Co, Zn, Co, Pt, Cu, $CrO_2$, and other oxides; metallic alloys; semiconducting materials; or combinations thereof. At least two of the sections should be of different metals. The inner B metal section of the above A-B-C nanowire can be subsequently used as a "sacrificial section" to form a nanoscale microelectrode gap that can be used in a biosensor. The microelectrode can be used for, but is not limited to, electrical applications. The biosensor can be used for biological and biotechnological applications, such as to detect biological species. A method of detecting a biological species is disclosed wherein a biological sample is provided followed by detecting a biological species from the sample using an embodiment of a presently disclosed biosensor.

The nanoporous membrane of the nonmetallic material can be a nonmetallic, nanoporous film. This nanoporous membrane can be formed via anodization of a metallic film in an acidic solution. The metallic film can be, but is not limited to, an aluminum film; whereas the nanoporous membrane can be, but is not limited to, an aluminum oxide film. The aluminum oxide film can contain an array of pores of nominally uniform diameter.

The pores can be partially filled or completely filled through electroplating or electrodeposition. The nanoporous membrane is immersed into a solution containing a salt of the metal (metal A) to be deposited. A wire is attached onto a surface of the membrane so that the wire acts as a cathode of an electrolytic cell. The metal cations are cathodically reduced to neutral metal with the application of an electric potential difference (a voltage). A negative charge on the membrane induces deposition of metal A into the plurality of pores. The pores are thus partially filled by electroplating the membrane for a controlled and/or predetermined amount of time.

Similarly, the membrane is immersed in a solution of a salt of metal B to partially fill the plurality of pores by electroplating the membrane for a controlled or predetermined amount of time. This is followed by immersion in a solution containing a salt of metal film C to deposit metal C to partially fill, or completely fill, the plurality of pores of the membrane and form a composite of a polymetallic, trisection, A-B-C configuration and the nonmetallic material.

The thickness of the sacrificial metal film section can be controlled or predetermined to be at a nanoscale level. The thickness of the sacrificial section (and thus the size of the nanogap upon using the nanowire to form a microelectrode or a biosensor) can be, but is not limited to, from about 0.1 nm to about 1000 µm; from about 1.0 nm to about 100 µm; from about 1.0 nm to about 100 nm; from about 1.0 nm to about 20.0 nm; and from about 1.0 nm to about 10.0 nm.

In an embodiment, metal A and metal C are the same or identical. Accordingly, the resultant nanowires will have a bimetallic, tri-sectioned A-B-A configuration. The inner metal B section can be a sacrificial section when forming a microelectrode or a biosensor. The thickness of the inner metal film B section can be controlled or predetermined to be of a desired nanoscale level having a range as previously disclosed for the nanowires having an A-B-C configuration. Metal A and metal B can be, but are not limited to, metals, such as gold, silver, Ni, Cr, Fe, Co, Zn, Co, Pt, Cu, Si, Ge, Sn, Ga, In, As, Sb and aluminum; $CrO_2$ and other oxides; metallic alloys; semiconducting materials, or combinations thereof. However, the metal of the inner, sacrificial section (metal B) should be distinct from the metal(s) used for the outer sections (metal A).

The nanowires of the A-B-C or A-B-A configurations are formed by removing the nonmetallic material from the composite. This can be achieved by chemically etching away, sonicating away and/or dissolving away the nonmetallic material, for example, alumina (aluminum oxide) from the membrane composite of the nanowire configuration and the nonmetallic material. Other membrane materials that can be used are PCTE and polycarbonates. In a similar fashion, nanowires of a pentasection configuration, such as A-B-C-B-A can be formed by depositing sections of A, B, C, B and A sequentially onto a membrane of the nonmetallic material followed by the removal of the nonmetallic material.

Variations within the scope of the present disclosure can be performed by, e.g., fabricating a pentasection nanowire (or a nanowire of any number of sections), such as a A-C-B-C-A nanowire, wherein metal B is sacrificed (e.g., etched away). The sections containing metal C can be significantly shorter or larger than those of metal A. Among other advantages, this pentasection nanowire can facilitate selective attachment of a biomolecule to the metal C regions without unwanted contamination of the metal A regions. This can be important in biosensing applications. Also, metal A can be magnetic, which can facilitate manipulation of the formed nanowire into position on a surface using external magnetic fields.

In an embodiment, the method begins with a porous aluminum oxide membrane that contains highly regular cylindrical channels. One side of the membrane is coated with a metal, and this metallic section is then used as an electrode for the electrodeposition of metal within the channels. After deposition, the electrode section is removed and the membrane is etched away, leaving metallic nanorods that can be as narrow as a few nanometers in diameter and micrometers long. The creation of these nanorods simply involves using different electrodeposition solutions for different periods of time.

In an embodiment, the method disclosed herein provides the ability to create nanorods composed of alternating lengths of gold and silver. Hence, nanorods with two long lengths of gold can be fabricated, sandwiching a length of silver that corresponds to the desired electrode spacing. Once they have been fabricated, the nanorods will be suspended in a solution, a drop of which will be placed on top of a microelectrode array that has been created with conventional lithographic equipment. Micron-scale glass beads can also be added to the liquid, and these spheres can be optically trapped and used to move individual nanorods to desired positions bridging two electrodes. Once the nanorods are in place, two-photon metal deposition can be used to anchor them and to create good electrical contacts with the microelectrodes. Once the remaining nanorods have been washed away, the silver section can be selectively etched using nitric acid, leaving gold nanoelectrodes spaced by the desired amount.

Regarding magnetic applications, nanowires or nanorods can be formed having an AMCMA, AMM'A or MCM configuration, wherein M and M' can be a magnetic metal. Electric current passing from end to end can be controlled by the relative orientations of the magnetic moments in the M/M' segments, a type of magnetic switch. Moreover, this can be useful in forming a magnetic tunnel junction, depending on the thickness and composition of material C. This can be particularly useful for both memory (MRAM) and magnetic sensing.

According to aspects illustrated herein, the presently disclosed method provides a potentially powerful route to fabrication of nanoscale electrode gaps of accurately controlled or predetermined size. Among potential uses of the presently disclosed nanoscale electrode gaps in biotechnology include, but are not limited to, protein and DNA nanowires to conduct electric current in nanocircuits; DNA switches that regulate the current going through nanowires; environmental bionanotechnology; nanoscale arrays for post-genomic science and nanofabrication of protein molecules.

In addition to the uses discussed above, various aspects of the currently disclosed method and device may be used in relation to many physical and chemical sensing opportunities.

For example, investigations into carbon nanotube (as well as a growing number of non-carbon nanotube and nanowire materials) technology often involve connecting nanotubes to metallic electrodes across a small EBL-defined gap. Studies on about 100 nm and longer carbon nanotubes show that electrical transport can be dominated by impurities and defects. If a process for shorter electrode gaps was available, correspondingly shorter nanostructures, such as nanotubes and nanowires, could be tested, potentially leading to smaller nanotube transistors and nanotube-based circuit elements.

A method of making polymetallic nanowires containing a plurality of metals comprising providing a porous membrane of a nonmetallic material having a plurality of pores; partially filling the plurality of pores of the porous membrane with a metal A; partially filling the plurality of pores of the porous membrane with a metal B to form a metal B section; partially filling the plurality of pores of the porous membrane with a metal C to form a polymetallic A-B-C configuration of the plurality of metals within the plurality of pores of the nonmetallic porous membrane; and removing the nonmetallic material to provide a plurality of nanowires having a polymetallic A-B-C configuration including an inner metal B section, wherein the plurality of nanowires have a length of from about 3.0 nm to about 1000 μm.

In the method, the length of the plurality of nanowires is from about 30 nm to about 100 μm. The method further comprises forming the porous membrane by anodizing a metallic film in an acidic solution. In the method, the porous membrane is a porous aluminum oxide film. In the method, the aluminum oxide film contains an array of pores of substantially uniform diameter. In the method, the metals A, B and C are each selected from the group consisting of a metal, a metal alloy, a metal oxide, a semiconducting material and combinations thereof. The method further comprises attaching a wire onto a surface of the porous membrane to act as a cathode of an electrolytic cell. The method further comprises immersing the membrane into a solution containing a salt of the metal A and electroplating the membrane for a predetermined amount of time to partially fill the plurality of pores with the metal A. The method further comprises immersing the membrane into a solution containing a salt of the metal B and electroplating the membrane for a predetermined amount of time to partially fill the plurality of pores with the metal B. The method further comprises immersing the membrane into a solution containing a salt of the metal C and electroplating the membrane for a predetermined amount of time to partially fill the plurality of pores with the metal C. In the method, the thickness of the metal B section of each of the plurality of nanowires is from about 0.1 nm to about 1000 μm. In the method, the thickness of the metal B section of each of the plurality of nanowires is from about 1.0 nm to about 100 μm. In the method, the thickness of the metal B section of each of the plurality of nanowires is from about 1.0 nm to about 20.0 nm. In the method, the thickness of the metal B section of each of the plurality of nanowires is from about 1.0 nm to about 10.0 nm. In the method, the metal A and metal C are the same and the nanowires has an A-B-A configuration. In the method, the metal A and metal B are selected from the group consisting of gold, silver, Ni, Cr, Fe, Co, Zn, Co, Pt, Cu, $CrO_2$ Si, Ge, Sn, Ga, In, As, Sb, aluminum and combinations thereof. In the method, the metal A is gold and the metal B is silver. In the method, the thickness of the metal B section in the A-B-A configuration is from about 0.1 nm to about 1000 μm. The method further comprises depositing the metal A and the metal B onto the membrane by electrodeposition of a solution of metal A and of a solution of metal B. The method further comprises removing the nonmetallic material by chemical etching, dissolving or sonication. In the method, the porous membrane is a nanoporous aluminum oxide film and wherein the metal A and the metal B are different and are selected from the group consisting of gold, silver, Ni, Cr, Fe, Co, Zn, Co, Pt, Cu, $CrO_2$ Si, Ge, Sn, Ga, In, As, Sb, aluminum and combinations thereof. A nanowire having an A-B-C configuration may be formed by the method. A nanowire having an A-B-C configuration may be formed by the method. A nanowire having an A-B-A configuration may be formed by the method. A nanowire having an A-B-A configuration may be formed by the method.

A method of making a microelectrode having a nanogap comprising providing at least two electrodes; placing a nanowire between the at least two electrodes; and removing metal B from the nanowire to provide a microelectrode having a nanogap between the at least two electrodes. A microelectrode for electrical applications comprising a microelectrode may be formed by the method. A microelectrode for magnetic applications comprising a microelectrode may be formed by the method. A biosensor device for detecting a biomolecule comprising a microelectrode may be formed by the method. The biomolecule may be DNA. A method of detecting a biological species comprising providing a biological sample, and using the biosensor device to detect a biological species in the sample.

A method of making a microelectrode having a nanogap comprising providing a nanowire; placing the nanowire on a substrate; removing metal B from the nanowire to form a nanogap; providing two electrodes; and attaching an electrode to metal A and an electrode to metal B to provide a microelectrode having a nanogap between the two electrodes.

A method of making a microelectrode comprising providing a membrane of an aluminum oxide material having a plurality of pores of a substantially uniform diameter; depositing a solution of a metal A onto a surface of the membrane; placing a wire onto the membrane to act as a cathode of an electrolytic cell; applying a negative potential on the membrane and immersing the membrane into a solution containing a salt of metal A; partially filling the plurality of pores of the membrane with metal A by electroplating the membrane for a predetermined amount of time; immersing the membrane in a solution containing a salt of a metal B; partially filling the plurality of pores of the membrane with metal B by electroplating the membrane for a predetermined amount of time to form a metal B section; immersing the membrane in a solution containing a salt of metal A; partially filling the plurality of pores of the membrane with the metal A by electroplating the membrane for a predetermined amount of time to form an A-B-A configuration within the plurality of pores of the membrane; removing the aluminum oxide material to provide a plurality of nanowires having an A-B-A bimetallic configuration including an inner metal B section; placing a nanowire between two electrodes; and selectively removing the inner metal B section from the nanowire to form a gap of from about 0.1 nm to about 1000 µm between the two electrodes, wherein the thickness of metal B is the size of the gap.

In the microelectrode, the size of the gap is from about 1.0 nm to about 100 µm. In the microelectrode, the size of the gap is from about 1.0 nm to about 20 µm. In the microelectrode, the size of the gap is from about 1.0 nm to about 10.0 nm. The microelectrode may be used for electrical applications or magnetic applications. A biosensor device for detecting a biomolecule comprising a microelectrode may be formed by the method. The biomolecule may be DNA. A method of detecting a biological species comprising providing a biological sample; and using the biosensor device to detect a biological species in the sample.

A method of making polymetallic nanowires containing a plurality of metals comprising providing a porous membrane of a nonmetallic material having a plurality of pores; partially filling the plurality of pores of the porous membrane with a metal A; partially filling the plurality of pores of the porous membrane with a metal C; partially filling the plurality of pores of the porous membrane with a metal B to form a metal B section; partially filling the plurality of pores of the porous membrane with the metal C; partially filling the plurality of pores of the porous membrane with the metal A to form a polymetallic A-C-B-C-A configuration of the plurality of metals within the plurality of pores of the nonmetallic porous membrane; and removing the nonmetallic material to provide a plurality of nanowires having a polymetallic A-C-B-C-A configuration including an inner metal B section, wherein the length of each of the plurality of nanowires is from about 3.0 nm to about 1000 µm.

In the method, the length of each of the plurality of nanowires is from about 30 nm to about 100 µm. In the method, the plurality of metals A, B and C are each selected from the group consisting of a metal, a metal alloy, a metal oxide, a semiconducting material and combinations thereof. In the method, the thickness of the metal B section is from about 0.1 nm to about 1000 µm. In the method, the thickness of the metal B section is from about 1.0 nm to about 100 µm. In the method, the thickness of the metal B section is from about 1.0 nm to about 20.0 nm. In the method, the thickness of the metal B section is from about 1.0 nm to about 10.0 nm.

A nanowire having a polymetallic A-B-A configuration of a metal A and a metal B, wherein the metal A and the metal B are different metals or metal alloys and the total length of the nanowire is from about 3 nm to about 1000 µm. The length of the nanowire is from about 30 nm to about 100 µm. The thickness of the metal B section is from about 1.0 nm to about 100 µm. The thickness of the metal B section is from about 1.0 nm to about 20.0 nm. The thickness of the metal B section is from about 1.0 nm to about 10.0 nm.

A microelectrode comprising a first electrode, a second electrode and at least two nanowire sections, wherein a first nanowire section is engaged to the first electrode and a second nanowire section is engaged to the second electrode, wherein there is a nanogap between the first nanowire section and the second nanowire section, and wherein the size of the nanogap is from about 1.0 nm to about 100 µm.

In the microelectrode, the size of the nanogap is from about 1.0 nm to about 20.0 nm. In the microelectrode, the size of the nanogap is from about 1.0 nm to about 10.0 nm. The microelectrode may be used for electrical applications or magnetic applications.

A biosensor device for detecting a biomolecule including a microelectrode, the microelectrode comprising a first electrode, a second electrode and at least two nanowire sections, wherein a first nanowire section is engaged to the first electrode and a second nanowire section is engaged to the second electrode, wherein there is a nanogap between the first nanowire section and the second nanowire section, and wherein the size of the nanogap is from about 1.0 nm to about 100 µm.

In the biosensor device, the size of the nanogap is from about 1.0 nm to about 20 nm. In the biosensor device, the size of the nanogap is from about 1.0 nm to about 10 nm. A method of detecting a biological species comprising providing a biological sample; and using the biosensor device to detect a biological species in the sample. The biological species may be DNA.

A method of making a polymetallic nanowire containing a plurality of metals comprising providing a porous membrane of a nonmetallic material having at least one pore; partially filling the at least one pore of the porous membrane with a metal A; partially filling the at least one pore of the porous membrane with a metal B to form a metal B section; partially filling the at least one pore of the porous membrane with a metal C to form a polymetallic A-B-C configuration of the plurality of metals within the at least one pore of the nonmetallic porous membrane; and removing the nonmetallic material to provide at least one nanowire having a polymetallic A-B-C configuration including an inner metal B section, wherein the length of the nanowire is from about 3.0 nm to about 1000 µm.

In the method, the length of the nanowire is from about 30 nm to about 100 µm. In the method, the thickness of the metal B section of the nanowire is from about 0.1 nm to about 1000 µm. In the method, the thickness of the metal B section of the nanowire is from about 1.0 nm to about 100 µm. In the method, the thickness of the metal B section of each of the plurality of nanowires is from about 1.0 nm to about 20.0 nm. In the method, the thickness of the metal B section of the nanowire is from about 1.0 nm to about 10.0 nm.

All patents, patent applications, and published references cited herein are hereby incorporated by reference in their entirety. It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method of forming a nanowire containing a nanogap comprising:
   providing a nanoporous membrane of a nonmetallic material having a plurality of pores;
   partially filling the plurality of pores of the nanoporous membrane with a first metal;
   partially filling the plurality of pores of the nanoporous membrane with a second metal to form an inner second metal section;
   partially filling the plurality of pores of the nanoporous membrane with a third metal to form a polymetallic configuration of the plurality of metals within the plurality of pores of the nanoporous membrane;
   removing the nanoporous membrane to provide a plurality of nanowires each having a length from about 1 µm to about 1000 µm and having a polymetallic configuration including the inner second metal section; and
   removing the inner second metal section to form a nanogap in the plurality of nanowires.

2. The method of claim 1 further comprising forming the nanoporous membrane by anodizing a metallic film in an acidic solution.

3. The method of claim 1 wherein the nanoporous membrane is an aluminum oxide film.

4. The method of claim 1 wherein the nanoporous membrane is a polycarbonate.

5. The method of claim 1 wherein the first metal, the second metal and the third metal are each selected from the group consisting of a metal, a metal alloy, a metal oxide, a semiconducting material and combinations thereof.

6. The method of claim 1 further comprising engaging a wire to a metallic material coated on the nanoporous membrane to act as a cathode of an electrolytic cell.

7. The method of claim 1 wherein the first metal and the third metal are the same metal resulting in a bimetallic nanowire.

8. The method of claim 1 wherein the first metal, the second metal and the third metal are each selected from the group consisting of Au, Ag, Al, Ni, Cr, Fe, Co, Zn, Co, Pt, Cu, $CrO_2$ Si, Ge, Sn, Ga, In, As, Sb, and combinations thereof.

9. The method of claim 1 wherein the first metal is gold and the second metal is silver.

10. The method of claim 1 further comprising depositing the first metal in the plurality of pores of the nanoporous membrane by electrodeposition of a solution of the first metal.

11. The method of claim 1 further comprising removing the nanoporous membrane by chemical etching, dissolving or sonication.

12. The method of claim 1 wherein a thickness of the second metal section of each of the plurality of nanowires is between about 1 nm and about 1000 nm.

13. A method of making a nanowire having a nanogap comprising:
   providing a membrane having a plurality of pores of a substantially uniform diameter;
   depositing a metal on a surface of the membrane;
   engaging a wire to the metal on the surface of the membrane to act as a cathode of an electrolytic cell;
   immersing the membrane into a solution containing a salt of a metal A and applying a negative potential on the membrane;
   partially filling the plurality of pores of the membrane with the metal A by electroplating the membrane;
   immersing the membrane in a solution containing a salt of a metal B;
   partially filling the plurality of pores of the membrane with the metal B by electroplating the membrane to form an inner metal B section;
   immersing the membrane in a solution containing a salt of a metal C;
   partially filling the plurality of pores of the membrane with the metal C by electroplating the membrane to form an A-B-C configuration within the plurality of pores of the membrane;
   removing the membrane to provide a plurality of nanowires having an A-B-C metallic configuration including the inner metal B section; and
   selectively removing the inner metal B section from the plurality of nanowires to form a gap in the nanowire from about 0.1 nm to about 1000 µm.

14. The method of making a nanowire of claim 13 wherein the metal A and the metal C are the same metal resulting in a bimetallic nanowire having an A-B-A configuration.

15. The method of making a nanowire of claim 13 further comprising arranging the nanowire to be situated between a first electrode and a second electrode to form a microelectrode.

16. The method of making a nanowire of claim 15 wherein the microelectrode is used for electrical applications.

17. The method of making a nanowire of claim 15 wherein the microelectrode is used for magnetic applications.

18. The method of making a nanowire of claim 15 wherein the microelectrode is a biosensor device for detecting a biomolecule.

19. A method of making polymetallic nanowires comprising:
   providing a nanoporous membrane of a nonmetallic material having a plurality of pores;

partially filling the plurality of pores of the nanoporous membrane with a metal A;

partially filling the plurality of pores of the nanoporous membrane with a metal C to form a first metal C section adjacent to the metal A;

partially filling the plurality of pores of the nanoporous membrane with a metal B to form an inner metal B section adjacent to the metal C section;

partially filling the plurality of pores of the nanoporous membrane with the metal C to form a second metal C section adjacent to the metal B section;

partially filling the plurality of pores of the nanoporous membrane with the metal A to form a polymetallic A-C-B-C-A configuration of the plurality of metals within the plurality of pores of the nanoporous membrane; and removing the nanoporous membrane to provide a plurality of nanowires each having a length from about 3.0 nm to about 1000 µm and having a polymetallic A-C-B-C-A configuration including the inner metal B section; and removing the inner metal B section to form a nanogap in the plurality of nanowires.

20. The method of claim 19 further comprising arranging the nanowire to be situated between a first electrode and a second electrode to form a microelectrode.

* * * * *